US012772889B2

(12) United States Patent
Lan et al.

(10) Patent No.: US 12,772,889 B2
(45) Date of Patent: Oct. 20, 2026

(54) TUNABLE FILTER HAVING A 3-D INDUCTOR AND A CAVITY EMBEDDED DIE WHICH INCLUDES A VARACTOR AND A CAPACITOR

(71) Applicant: QUALCOMM Incorporated, San Diego, CA (US)

(72) Inventors: Je-Hsiung Lan, San Diego, CA (US); Jonghae Kim, San Diego, CA (US); Ranadeep Dutta, Del Mar, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 652 days.

(21) Appl. No.: 18/153,663

(22) Filed: Jan. 12, 2023

(65) Prior Publication Data

US 2024/0243036 A1 Jul. 18, 2024

(51) Int. Cl.

| | |
|---|---|
| ***H10W 70/68*** | (2026.01) |
| ***H03H 7/01*** | (2006.01) |
| ***H10D 84/00*** | (2025.01) |
| ***H10W 70/60*** | (2026.01) |
| ***H10W 70/63*** | (2026.01) |
| ***H10W 70/692*** | (2026.01) |

(52) U.S. Cl.

CPC ........ *H10W 70/682* (2026.01); *H03H 7/0153* (2013.01); *H03H 7/1741* (2013.01); *H10D 84/201* (2025.01); *H10W 70/614* (2026.01); *H10W 70/635* (2026.01); *H10W 70/692* (2026.01); *H03H 7/0115* (2013.01); *H03H 2210/025* (2013.01)

(58) Field of Classification Search

CPC .......... H10D 84/204; H10D 1/64; H10D 1/68; H10D 84/201; H10D 84/40; H10D 84/60; H10W 70/614; H10W 70/635; H10W 70/682; H10W 70/692; H10W 20/40; H10W 70/60; H10W 70/69; H03H 7/0153

See application file for complete search history.

(56) References Cited

U.S. PATENT DOCUMENTS

| | | | | |
|---|---|---|---|---|
| 4,458,215 | A * | 7/1984 | Huang | H03B 5/1852 257/E27.113 |
| 2011/0309420 | A1* | 12/2011 | Chang | H10B 43/30 257/E27.03 |
| 2015/0076626 | A1* | 3/2015 | Nakamura | H01G 5/18 438/52 |
| 2017/0140862 | A1 | 5/2017 | Yun et al. | |
| 2019/0393360 | A1* | 12/2019 | Pathak | H10D 1/20 |
| 2021/0099149 | A1* | 4/2021 | Lan | H01F 17/0033 |
| 2022/0014176 | A1 | 1/2022 | Lan et al. | |

(Continued)

OTHER PUBLICATIONS

International Search Report and Written Opinion—PCT/US2023/086393—ISA/EPO—May 16, 2024.

*Primary Examiner* — Eliseo Ramos Feliciano
*Assistant Examiner* — Brad A Knudson
(74) *Attorney, Agent, or Firm* — Muncy, Geissler, Olds & Lowe, P.C.

(57) ABSTRACT

Disclosed is a cavity embedded tunable filter integrated with high-quality and high capacitance tuning ratio varactor, metal-insulator-metal (MIM) capacitors, and 3D inductors with through alumina ceramic substrate vias. The varactor and the MIM capacitor die is embedded into a blind alumina cavity (BAC) of an alumina ceramic substrate.

28 Claims, 13 Drawing Sheets

(56) References Cited

U.S. PATENT DOCUMENTS

| | | | | |
|---|---|---|---|---|
| 2023/0085411 | A1* | 3/2023 | Paital | H10W 70/09<br>257/621 |
| 2023/0197697 | A1* | 6/2023 | Pietambaram | H01L 23/5383<br>257/668 |
| 2023/0207439 | A1* | 6/2023 | Elsherbini | H10W 70/65<br>257/774 |
| 2024/0113037 | A1* | 4/2024 | Weis | H10W 42/20 |
| 2024/0213946 | A1* | 6/2024 | Du | H03H 7/0115 |
| 2025/0056729 | A1* | 2/2025 | Kubo | H05K 1/185 |

* cited by examiner

TUNABLE FILTER HAVING A 3-D INDUCTOR AND A CAVITY EMBEDDED DIE WHICH INCLUDES A VARACTOR AND A CAPACITOR

FIELD OF DISCLOSURE

This disclosure relates generally to die packages or modules, and more specifically, but not exclusively, to die packages/modules that include cavity-embedded tunable filter in a substrate, such as alumina ceramic substrate, and fabrication techniques thereof.

BACKGROUND

Integrated circuit technology has achieved great strides in advancing computing power through miniaturization of active components. The package devices can be found in many electronic devices, including processors, servers, radio frequency (RF) integrated circuits, etc. Packaging technology becomes cost-effective in high pin count devices and/or high production volume components.

Tunable filter with variable capacitor (varactor), which is a voltage controlled capacitor, is desirable for both cellular and Wi-Fi communications in its RF front end (RFFE) applications to cover multiple bands and multiple frequencies. Varactors with large Cmax/Cmin tuning ratio (TR), good isolation, linearity, and Q-factor, as well as high power handling capability are among the key performance indicators (KPI) for technology benchmark.

For high performance varactor device with RF KPI, there have been few technology choices for RFFE considerations. For example, silicon-on-insulator (SOI) and microelectromechanical systems (MEMS) varactors on Si substrate and MEMS varactor on glass substrate have been developed. MEMS varactor shows high tuning capability (e.g., TR>8). Unfortunately, it requires a high voltage charge pump (e.g., >20 V) for capacitor tuning.

High-Q 3D through-substrate via (TSV) inductor built on low-loss and high thermally-conductive substrate is also desirable for the RF filters used in the TX path, that not only allows for low insertion loss but also enables high-power handling capability. Among the available 3D TSV substrates, neither Si nor glass can meet both high-Q and high-power handling requirements. Sapphire or alumina can be used as substrate. However, their low TSV etch rate using traditional photolithography (batch process) means that sequential laser scan/drill process is used resulting in low throughput.

Accordingly, there is a need for systems, apparatus, and methods that overcome the deficiencies of conventional multi-die modules including the methods, system and apparatus provided herein.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

An exemplary tunable filter is disclosed. The tunable filter may comprise a substrate with a blind substrate cavity (BSC) formed therein. The BSC may penetrate a depth from a frontside of the substrate. The tunable filter may also comprise a varactor/cap die within the BSC. The varactor/cap die may comprise a varactor and a capacitor. The tunable filter may further comprise one or more through-substrate-vias (TSV) in the substrate. Each TSV may extend from the frontside of the substrate to a backside of the substrate. The tunable filter may yet comprise one or more frontside redistribution layer (RDL) metals on the frontside of the substrate. The one or more frontside RDL metals may be electrically connected with the one or more TSVs, the varactor, and the capacitor. The tunable filter may yet further comprise one or more backside RDL metals on the backside of the substrate. The one or more backside RDL metals may be electrically connected with the one or more TSVs. The one or more TSVs, the one or more frontside RDL metals, and the one or more backside RDL metals may be configured to form one or more inductors.

A method of fabricating an exemplary multi-die module is disclosed. The method may comprise providing a substrate with a blind substrate cavity (BSC) formed therein. The BSC may penetrate a depth from a frontside of the substrate. The method may also comprise providing a varactor/cap die within the BSC. The varactor/cap die may comprise a varactor and a capacitor. The method may further comprise forming one or more through-substrate-vias (TSV) in the substrate. Each TSV may extend from the frontside of the substrate to a backside of the substrate. The method may yet comprise forming one or more frontside redistribution layer (RDL) metals on the frontside of the substrate. The one or more frontside RDL metals may be electrically connected with the one or more TSVs, the varactor, and the capacitor. The method may yet further comprise forming one or more backside RDL metals on the backside of the substrate. The one or more backside RDL metals may be electrically connected with the one or more TSVs. The one or more TSVs, the one or more frontside RDL metals, and the one or more backside RDL metals may be configured to form one or more inductors.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

Figure 1:
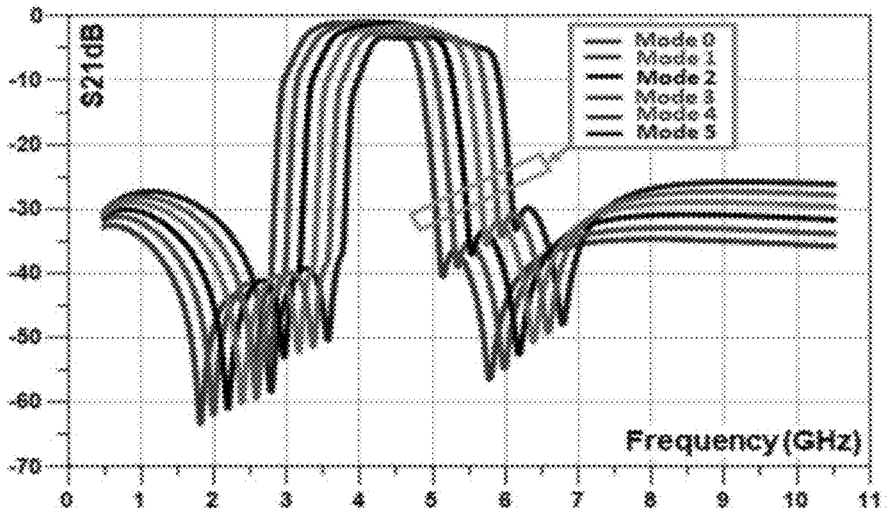
FIG. 1 illustrates frequency responses of an example tunable filter

Other objects and advantages associated with the aspects disclosed herein will be apparent to those skilled in the art based on the accompanying drawings and detailed description. In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description and related drawings directed to specific embodiments. Alternate aspects or embodiments may be devised without departing from the scope of the teachings herein. Additionally, well-known elements of the illustrative embodiments herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary embodiments. In such instances, internal details of the known, conventional component structures and/or portions of operations may be omitted to help avoid potential obfuscation of the concepts illustrated in the illustrative embodiments disclosed herein.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It is mentioned above that tunable filter with variable capacitor (varactor) is desirable for both cellular and Wi-Fi communications in its RF front end (RFFE) applications to cover multiple bands and multiple frequencies. FIG. 1 illustrates frequency responses of an example tunable filter. As seen, by tuning the tunable filter, the desirable frequency response mode may be selected. The desirable features of a tunable filter include (among others):

Low routing parasitic components;
High tunable ratio capacitor;
HQ and precise inductors;
Compact/small footprint;
Performance (low insertion loss);
Low bias voltage.

Figure 2:
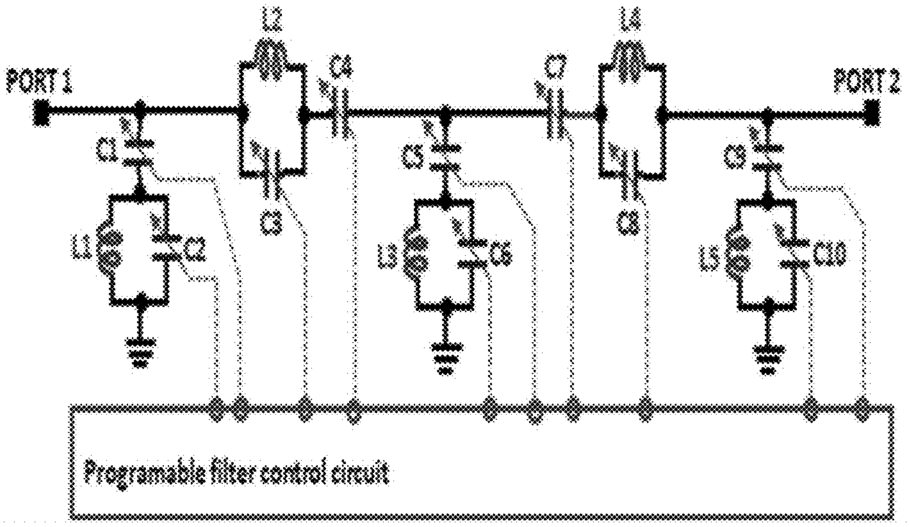
FIG. 2 illustrates a circuit topology of an example tunable filter.

FIG. 2 illustrates a circuit topology of an example tunable filter with five inductors L1-L5. In this instance, it is desirable that the second and fourth inductors (L2, L4) be very precise. For example, the inductances of L2 and L4 may be within 3% of their desired values. Alternatively or in addition thereto, the inductances of L2 and L4 may be within 3% of each other. The first, third and fifth inductors (L1, L3, L5) need not be as precise as L2 and L4. Nonetheless, high precision is desirable. For example, the inductances of L1, L3 and L5 may be within 5% of their desired values. Alternatively or in addition thereto, the inductances of L1, L3 and L5 may be within 5% of each other. Such precision of inductors L1-L5 allows for precise tuning of the tunable filters.

Figure 3:
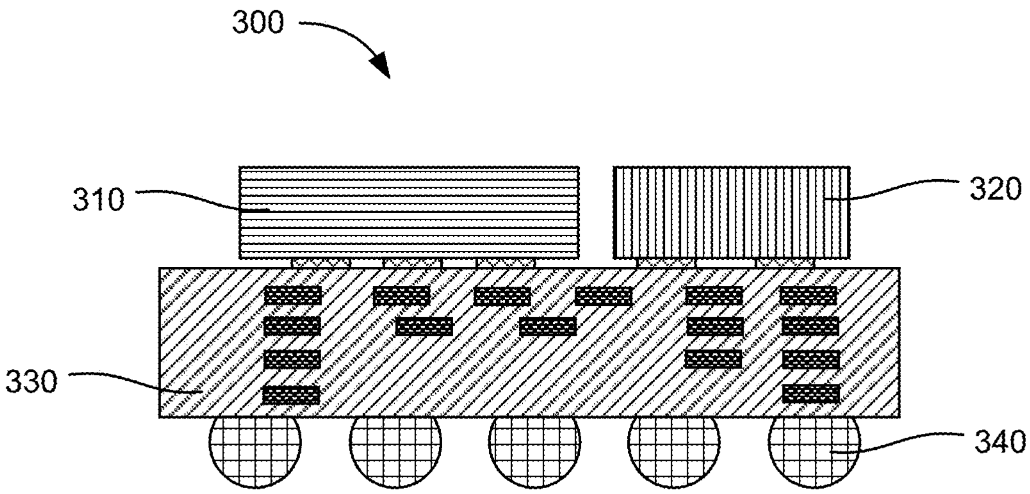
FIG. 3 illustrates an example of a conventional tunable filter.

FIG. 3 illustrates an example of an existing tunable filter 300. As seen, the conventional tunable filter 300 includes a varactor die 310, SMT device 320, a laminate substrate 330 ball grid array (BGA) 340. The varactor die 310 and the SMT device 320 are mounted on the laminate substrate. The L2 and L4 inductors are implemented in the SMT device 320, and the L1, L3, L5 inductors are implemented within the laminate substrate 330. As a result, large parasitic losses can occur (e.g., due to long path). Also, the tuning ratio (TR) of the varactor die (Cmax/Cmin) can be less than 4. Further, the inductor variation can be greater than 10%. Thermal handling can be poor since the varactor die 310 and the SMT device 320 are far away from the BGA 340. In addition, the module size can be large (e.g., greater than 150 μm thick). Yet further, the cost can be high (SMT devices can be expensive).

In accordance with the various aspects disclosed herein, to address issues associated with conventional tunable filters, a compact cavity embedded tunable filter is proposed. The proposed tunable filter may be integrated with high-quality (HQ) and high capacitance tuning-ratio (HTR) varactors, metal-insulator-metal (MIM) capacitors, and 3D solenoid inductors with through alumina ceramic substrate via (TAV) for next generation Wifi RFFE application. The varactor and MIM capacitor die(s) may be embedded into a 3D blind alumina cavity (BAC) ceramic substrate die-to-wafer (D2W), followed by a thermally conductive (TC) dry film filler to planarize the embedded varactor die(s) and alumina surface. The device build may be followed by 3D TAV inductor formation, e.g., by copper (Cu) redistribution layer (RDL) processes on the thin alumina substrate.

Some of the distinct features of the proposed tunable filter includes:

Compact cavity embedded tunable filter.
Low parasitic integrated inductors (L) and capacitor(s) (C).
High capacitance tuning ratio (HTR) varactor (e.g., GaAs hyper-abrupt (HA) varactor).
HQ and precise inductors by TAV 3D inductors.
High thermally conductive alumina ceramic substrate and blind cavity.
Thermally conductive dry film in the blind alumina cavity (BAC).
High performance filter with lower insertion loss.

Figure 4:
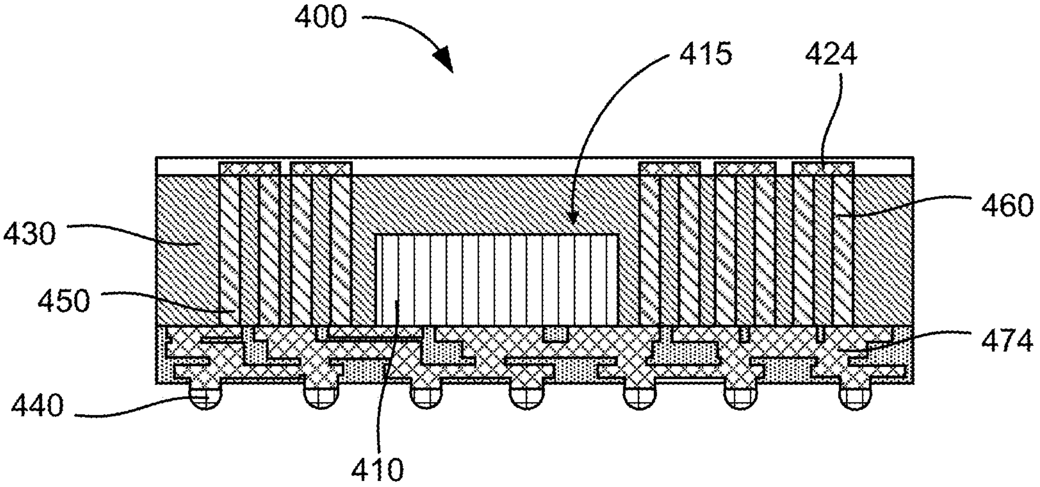
FIG. 4 illustrates an example of a tunable filter in accordance with at one or more aspects of the disclosure.

FIG. 4 illustrates an example of a tunable filter in accordance with at one or more aspects of the disclosure. The tunable filter 400 may include a varactor/cap die 410 in a substrate 430. The substrate 430 may be thermally conductive substrate such as an alumina ceramic substrate. The varactor/cap die 410 may be embedded in a BAC 415 of the substrate 430. The varactor/cap die 410 may include a III-V varactor—such as a GaAs varactor—with hyper-abrupt (HA) junction active layer that can achieve high TR with lower bias voltage (e.g., ~5v). In an aspect, the varactor/cap die 410 may also include MIM capacitor(s).

External connects 440 may be formed on the frontside RDL metals 474 to provide connections to devices external to the tunable filter 500.

The illustrated tunable filter 400 (as well as other proposed tunable filters) may be cavity-embedded in and cointegrated with the alumina ceramic substrate 430. Alumina with TAV and BAC can result in low insertion loss (e.g., less than 0.6 dB). Other technical advantages include high TR varactor (e.g., ~6 with GaAs, ~8 with MEMS), HQ and precise 3D TAV inductors (e.g., HQ greater than 100, variation less than 3%), improved thermal handling (high TC alumina (30 W/m-k), vertical Cu TAV path), size (e.g., less than 100 μm due to dies being embedded in substrate), and cost (less expensive due to high integration with reduced components).

Figure 5A:
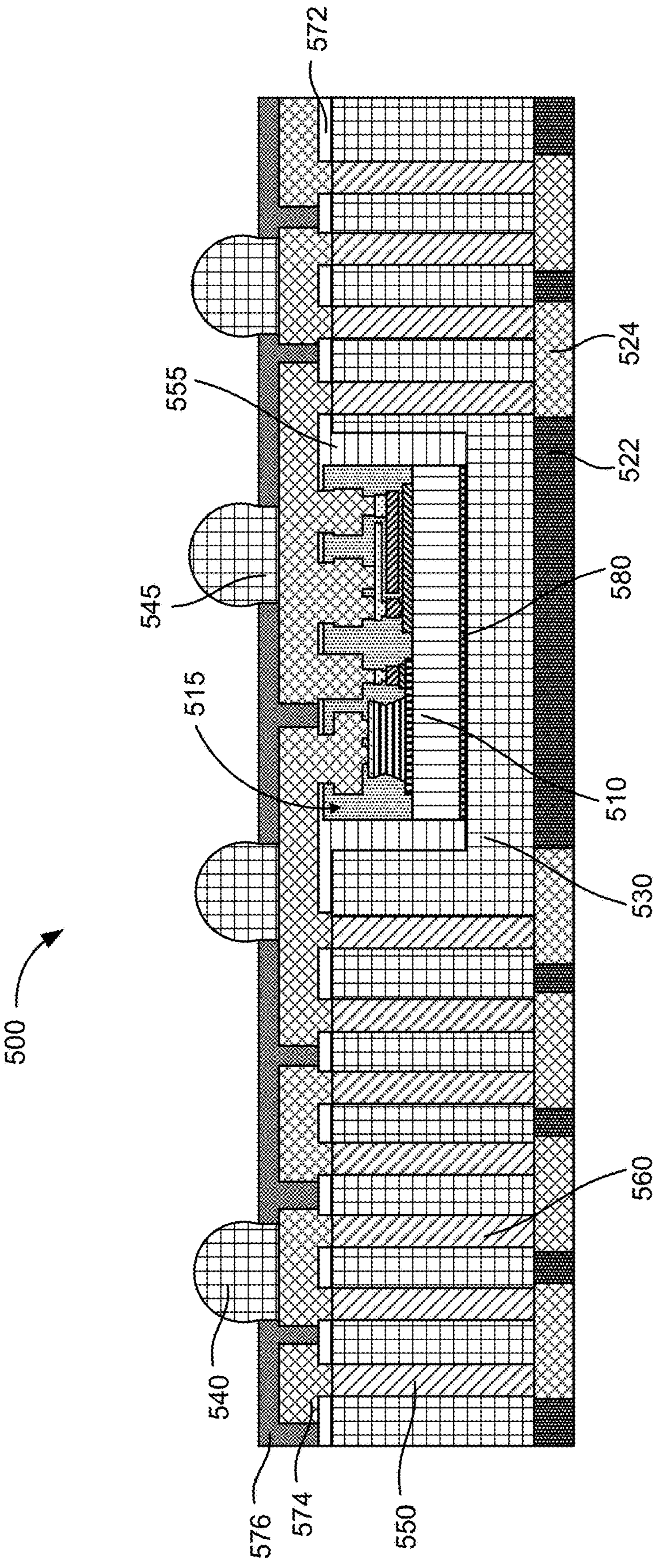
FIG. 5A illustrates an example of a tunable filter in accordance with at one or more aspects of the disclosure.

FIG. 5A illustrates another example of a tunable filter in accordance with at one or more aspects of the disclosure. In an aspect, the tunable filter 500 of FIG. 5 may be considered to provide more detailed view of the tunable filter 400 of FIG. 4. The tunable filter 500 may include a varactor/cap die 510 in a substrate 530. The substrate 530 may be thermally conductive, i.e., thermal conductivity that is greater than 2 W/m-K. Note that thermal conductivity of alumina ceramic substrate is 30 W/m-K. The varactor/cap die 510 may be embedded in a BSC 515 of the substrate 530 with help of an adhesive 580. When the substrate 530 is alumina ceramic substrate, the BSC 515 may also be referred to as the BAC 515. The BSC/BAC 515 may penetrate a depth from a frontside of the substrate 530. The varactor/cap die 510 may include a III-V varactor (e.g., GaAs varactor) with hyper-abrupt (HA) junction active layer. The varactor/cap die 510 may also include one or more MIM capacitors.

One or more TSVs 550 (or TAVs when formed in alumina) may also be formed within the substrate 530. Each TAV 550 may extend from the frontside of the substrate 530 to the backside of the substrate 530. On the frontside, the exposed frontside surfaces of the substrate 530 and the TAVs 550 may be planar. On the backside, the exposed backside surfaces of the substrate 530 and the TAVs 550 may be planar.

One or more backside RDL metals 524 may be formed on a backside of the substrate 530. A backside interlayer dielectric (ILD) 522 may also be formed on backside (lower side in FIG. 5A) of the substrate 530. The backside ILD 522 may encapsulate the backside RDL metals 524. The backside RDL metals 524 may be in electrical connection with the TAVs 550. For example, the backside RDL metals 524 may be in direct contact with the TAVs 550 on the backside.

A first frontside ILD 572 may be formed on the frontside (upper side in FIG. 5A) of the substrate 530. The first frontside ILD 572 may be formed such that one or more TAVs 550 are exposed at the frontside of the substrate. The first frontside ILD 572 may also be formed such that connections to the varactor/cap die 510 is exposed.

One or more frontside RDL metals 574 may be formed on the first frontside ILD 572 and on the frontside of the substrate 530 through the exposed portions of the frontside ILD 572. The frontside RDL metals 574 may be in electrical connection with the TAVs 550. The frontside RDL metals 574 may also be in electrical connection with the connections of the varactor/cap die 510. For example, the frontside RDL metals 574 may be in direct contact with the TAVs 550 on the front side and/or with the connections of the of the varactor/cap die 510.

A second frontside ILD 576 may be formed on the frontside RDL metals 574 and on the first frontside ILD 572. Portions of the second frontside ILD 576 may be removed so as to expose the frontside RDL metals 574. Underbump metallizations (UBM) 545 may be formed within the exposed portions of the second frontside ILD 576. External connects 540 may be formed on the corresponding UBMs 545. For example, external connects 540 may be in direct contact with the UBMs 545. In this way, the external connects 540 provide a way to electrically connect the tunable filter 500 with devices external to the tunable filter 500. Bumps, solder balls, land grid arrays (LGA), etc. may be examples of the external connects 540.

Figure 5B:
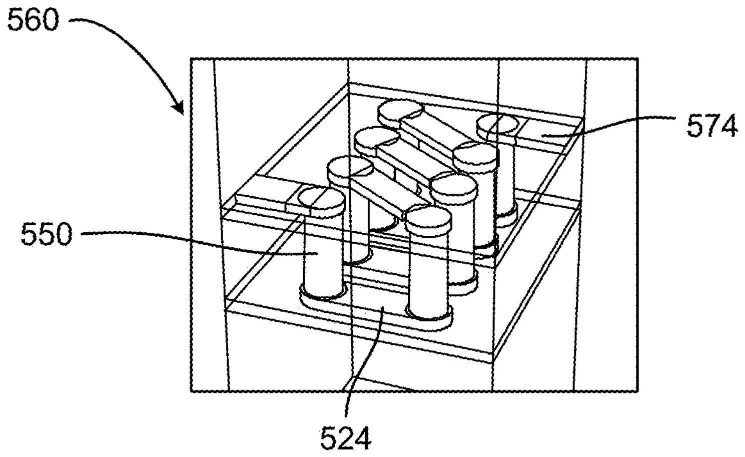
FIG. 5B illustrate an expanded view of a 3D inductor of a tunable filter in accordance with at one or more aspects of the disclosure.

FIG. 5B illustrate an expanded view of a 3D inductor 560 of a tunable filter in accordance with at one or more aspects of the disclosure. [it] It is seen that the 3D inductors 560 may be formed by forming conductive loops with the TAVs 550, frontside RDL metals 574 and backside RDL metals 524. In general, there may be one or more 3D inductors 560. Each 3D inductor 560 may comprise one or more loops, and each loop may comprise at least one TAV 550 in electrical connection with at least one frontside RDL metal 574 and with at least one backside RDL metal 524.

Figure 5C:
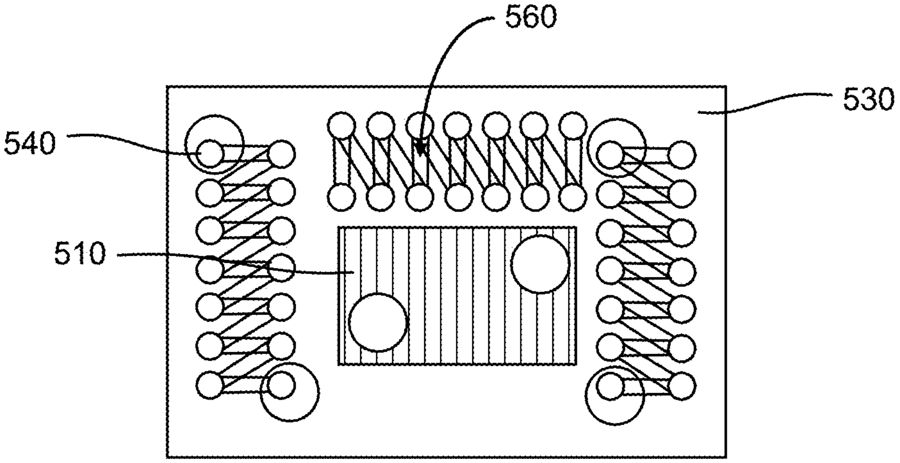
FIGS. 5C and 5D illustrate frontside views of tunable filters in accordance with at one or more aspects of the disclosure.

FIG. 5C illustrates a view from the frontside of the substrate 530. As seen, there can be one or more 3D inductors 560. When there is a plurality of 3D inductors 560, the plurality of 3D inductors 560 may correspond to the inductors of the circuit topology illustrated in FIG. 2. While not shown in FIG. 5B, one or more 2D inductors may also be formed by connecting some of the frontside RDL metals 574 in one or more loops on the frontside of the substrate 530, and/or by connecting some of the backside RDL metals 524 in one or more loops on the backside of the substrate 530.

Figure 5D:
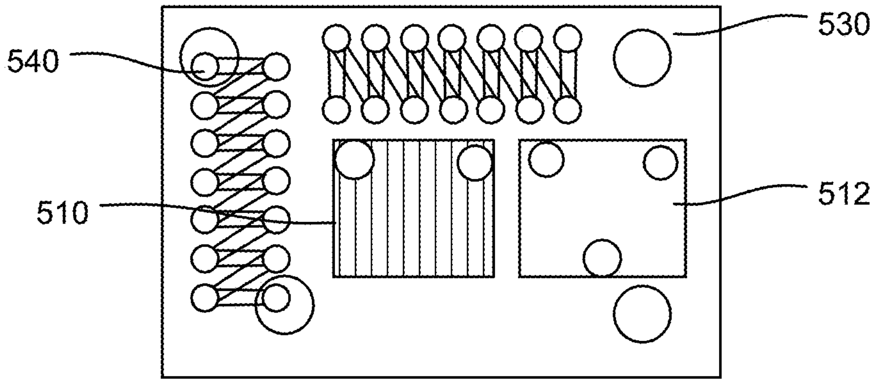

It should be noted that different technologies can also be mixed. FIG. 5D illustrates another view from the frontside of the substrate 530. As seen, a controller 512 may also be provided within the substrate 530. That is, the controller 512 may also be embedded within the BAC of the substrate 530, and electrical connections to the controller 512 may be provided through the external connects 540, the UBMs 545 and the frontside RDL metals 574. The controller 512 may be formed from technology different from the varactor/cap die 510. For example, the controller 512 may be CMOS based.

Note that the controller 512 is simply an example of another die that may be embedded in the BSC/BAC 515. Also, while one BSC/BAC 515 is illustrated, there can be any number of BSCs/BACs 515. For example, to enhance isolation between the varactor/cap die 510 and another die (such as the CMOS controller 512), two BSCs/BACs 515 may be formed and the varactor/cap die 510 may be embedded within a first BSC/BAC 515 and the another die may be embedded within a second BSC/BAC 515.

Figure 6:
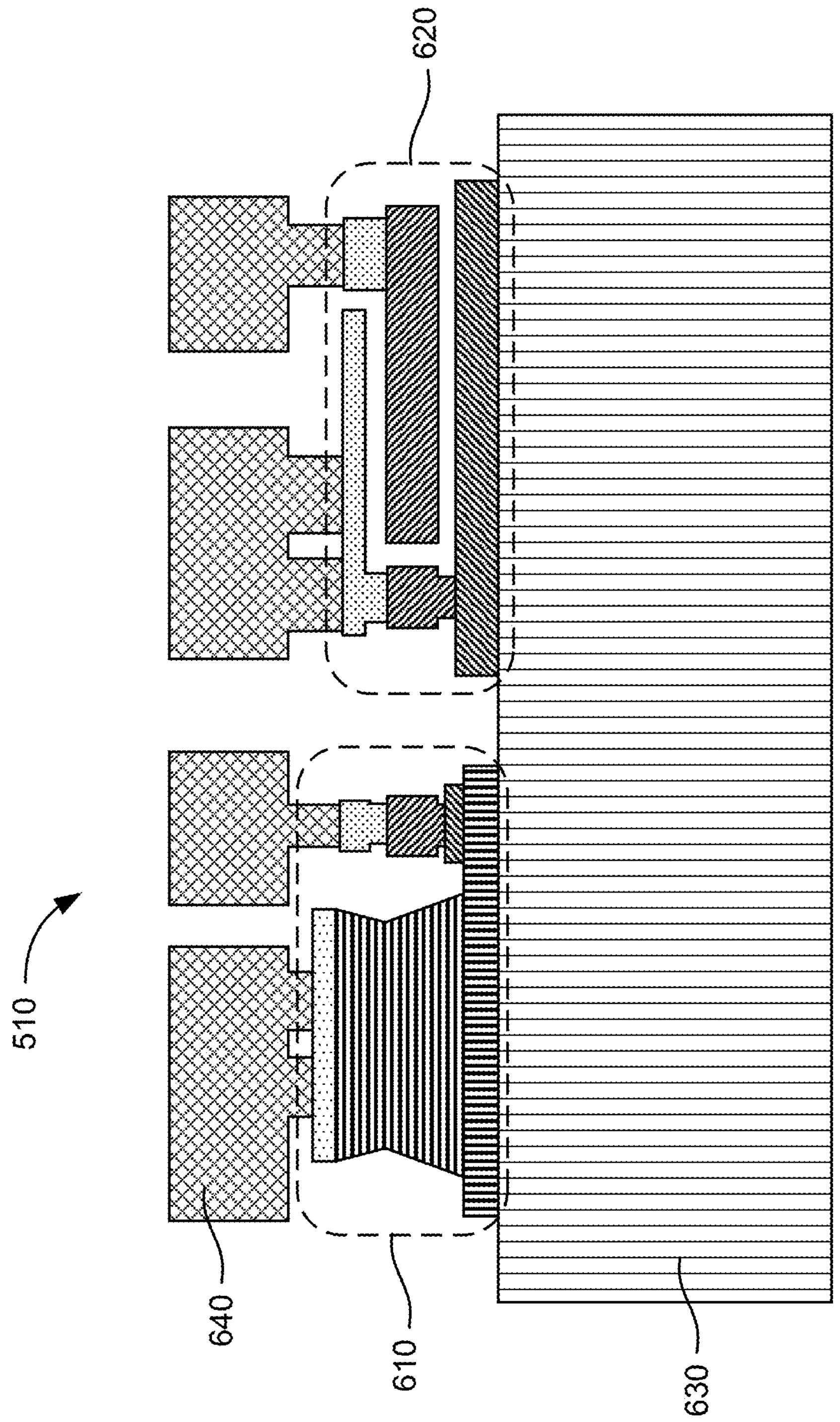
FIG. 6 illustrates an example of a varactor/cap die in accordance with at one or more aspects of the disclosure.

FIG. 6 illustrates an example of the varactor/cap die 510 in accordance with at one or more aspects of the disclosure. As seen, the varactor/cap die 510 may include a varactor 610 formed on a first side of a varactor/cap substrate 630. As seen in FIG. 5A, a second side of the varactor/cap substrate 630 (opposite the first side) may be on a lateral surface of the substrate 530 within the BSC/BAC 515. For a more secure placement of the varactor/cap die 510, the adhesive 580 may be utilized.

The varactor 610 may include a hyper-abrupt junction active layer. In FIG. 6, the varactor 610 is illustrated as being a GaAs varactor. However, generally, the varactor 610 is not so limited. For example, the varactor 610 may be from other III-V materials. Similarly, the varactor/cap substrate 630 may be formed from III-V materials such as GaAs.

The varactor/cap die 510 may include an MIM capacitor 620 also formed on the first side of the varactor/cap substrate 630. Varactor/cap connects 640 may be in electrical connection with the varactor/cap die 510 and/or with the MIM capacitor 620. As seen in FIG. 5A, the varactor/cap connects 640 may also be in electrical connection with the frontside RDL metals 574. The Varactor/cap connects 640 may be formed of metal such as Cu, Al, etc.

A process flow to fabricate a tunable filter (such as tunable filters 400, 500) may generally be described as follows:

Forming TAV (TSV generally) holes and BAC (BSC generally).

Embedding varactor/cap die in BAC (BSC) of substrate.

Applying thermally conductive dry film, and application of first ILD.

Forming TAV (TSV), backside RDL metals and frontside RDL metals (e.g., by plating);

Applying backside ILD, frontside ILD and frontside passivation/

Forming UBMs and external connects.

Figure 7A:
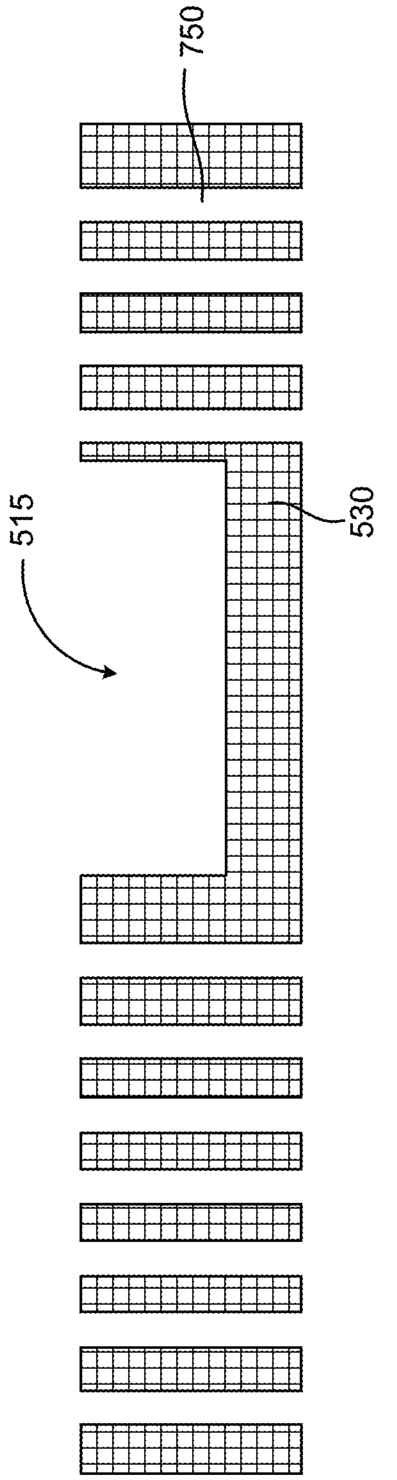
FIGS. 7A-7I illustrate examples of stages of fabricating a tunable filter in accordance with at one or more aspects of the disclosure.

FIGS. 7A-7H illustrate examples of stages of fabricating a tunable filter—such as tunable filters 400, 500—in accordance with at one or more aspects of the disclosure. FIG. 7A illustrates a stage in which the BAC/BSC 515 and TAV/TSV holes 750 may be formed in the substrate 530. While not illustrated, the backside (lower side in FIG. 7A) of the substrate 530 may be supported on a temporary carrier.

Figure 7B:
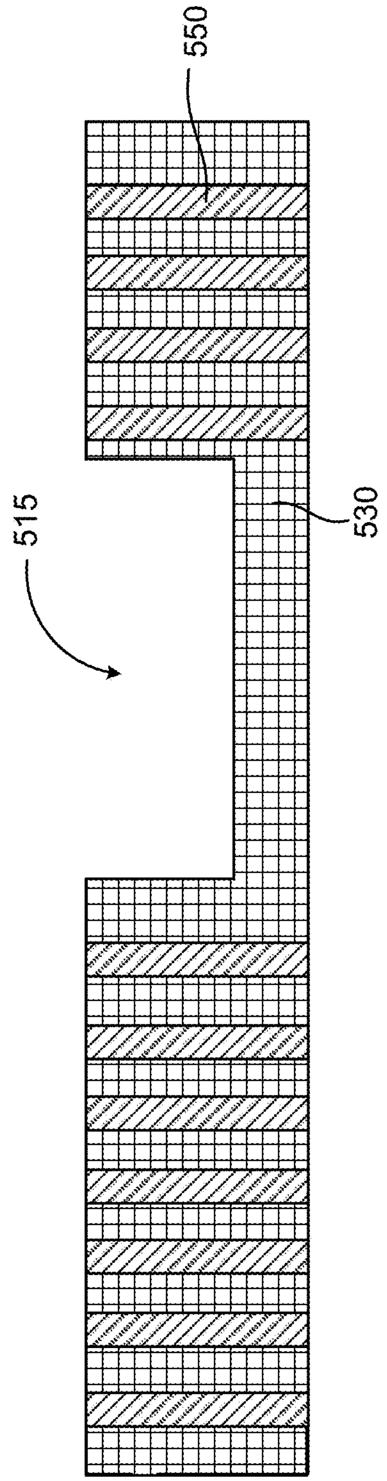

FIG. 7B illustrates a stage in which the TAV/TSV holes 750 may be filled with metals (e.g., Cu, Al, W, Pd, Ni, Au, Ta, Ti, Sb, Mo, Ru, etc.) to form the TAVs/TSVs 550. For example, a metal such as Cu is preferred for its low resistance/high conductance and may be plated.

Figure 7C:
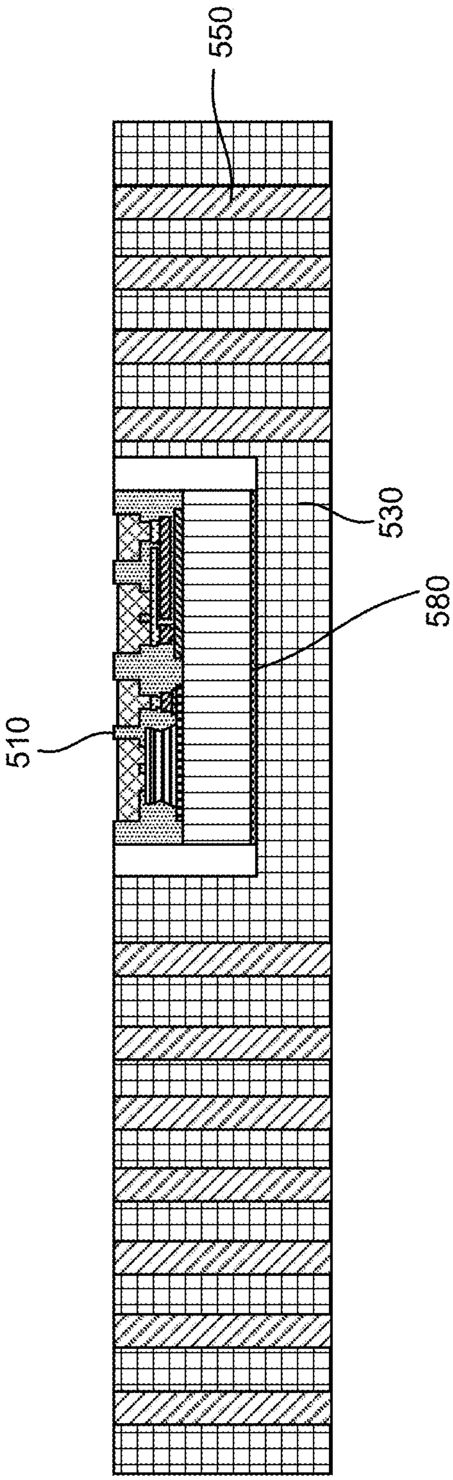

FIG. 7C illustrates a stage in which the varactor/cap die 510 may be embedded within the substrate 530. An adhesive 580 may be used to used to attach the varactor/cap die 510 to the BAC 515. In particular, the adhesive 580 may be used to attach the second side of the varactor/cap substrate 630 to a lateral surface of the substrate 530 within the BAC 515.

Figure 7D:
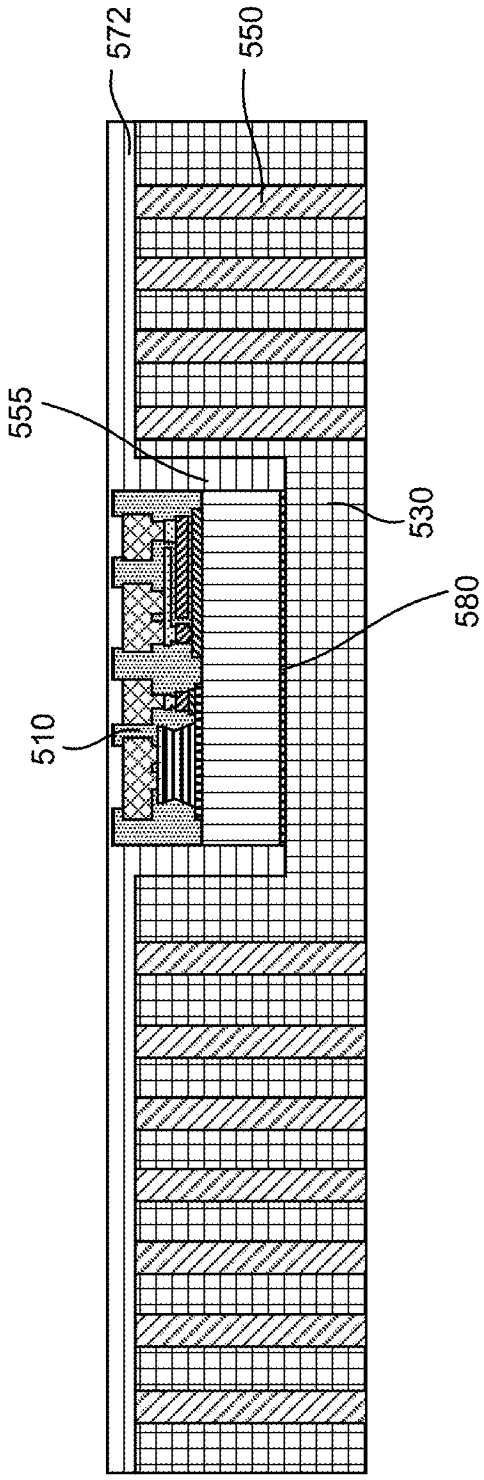

FIG. 7D illustrates a stage in which the thermally conductive dry film 555 and the first frontside ILD 572 may be formed. The dry film 555 may fill gaps between side surfaces of the BAC 515 and the varactor/cap die 510. In an aspect, the thermally conductive dry film 555 and the first frontside ILD 572 may be formed from a same dielectric material. For example, a dielectric material may be applied such that the dry film 555 and the first frontside ILD 572 are integrally formed. In an aspect, thermal conductivity of the dry film 555 may be at least 2 W/m-K.

Figure 7E:
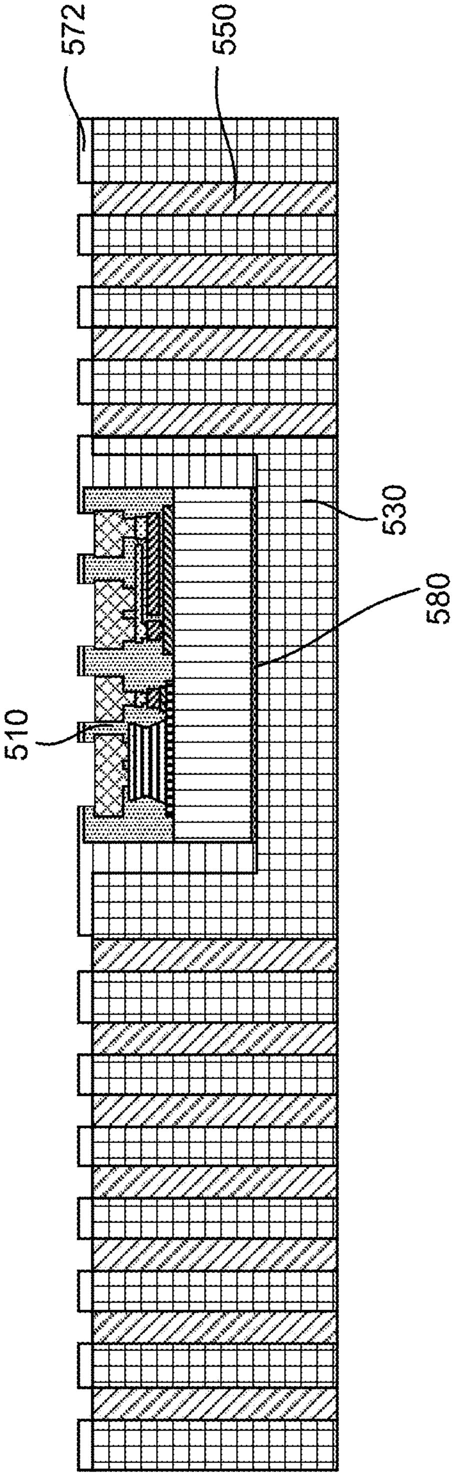

FIG. 7E illustrates a stage in which first frontside ILD 572 may be patterned (e.g. through photomasking) to expose the TAVs/TSVs 550 and the varactor/cap connects 640 on the frontside of the substrate 530.

Figure 7F:
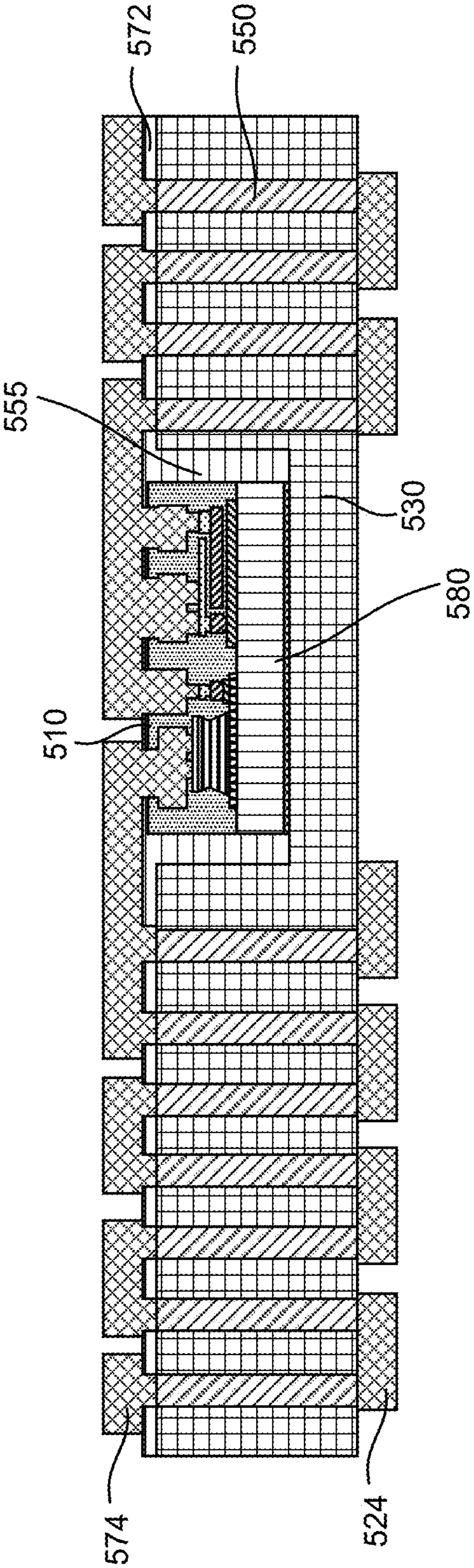

FIG. 7F illustrates a stage in which frontside RDL metals 574 and backside RDL metals 524 may be formed on the front and backsides of the substrate 530, respectively. In an aspect, a double-side plating/metallization (e.g., with Cu, Al, W, etc.) may be performed.

Figure 7G:
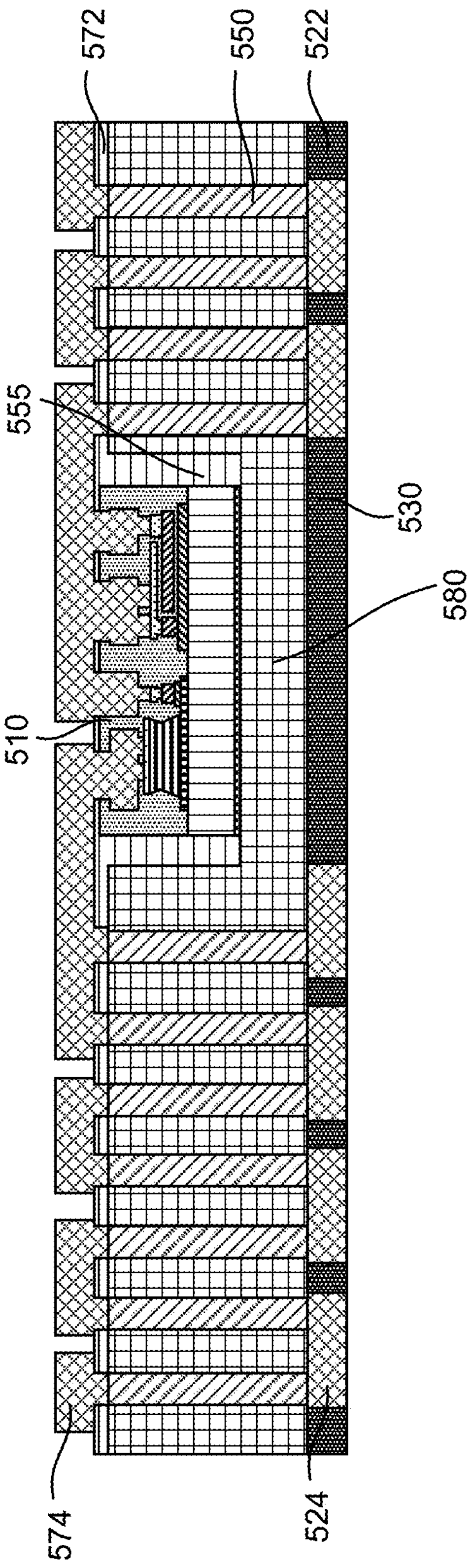

FIG. 7G illustrates a stage in which a backside interlayer dielectric (ILD) 522 may be formed on the backside of the substrate 530. The backside ILD 522 may be patterned to form openings that expose the backside RDL metals 524.

Figure 7H:
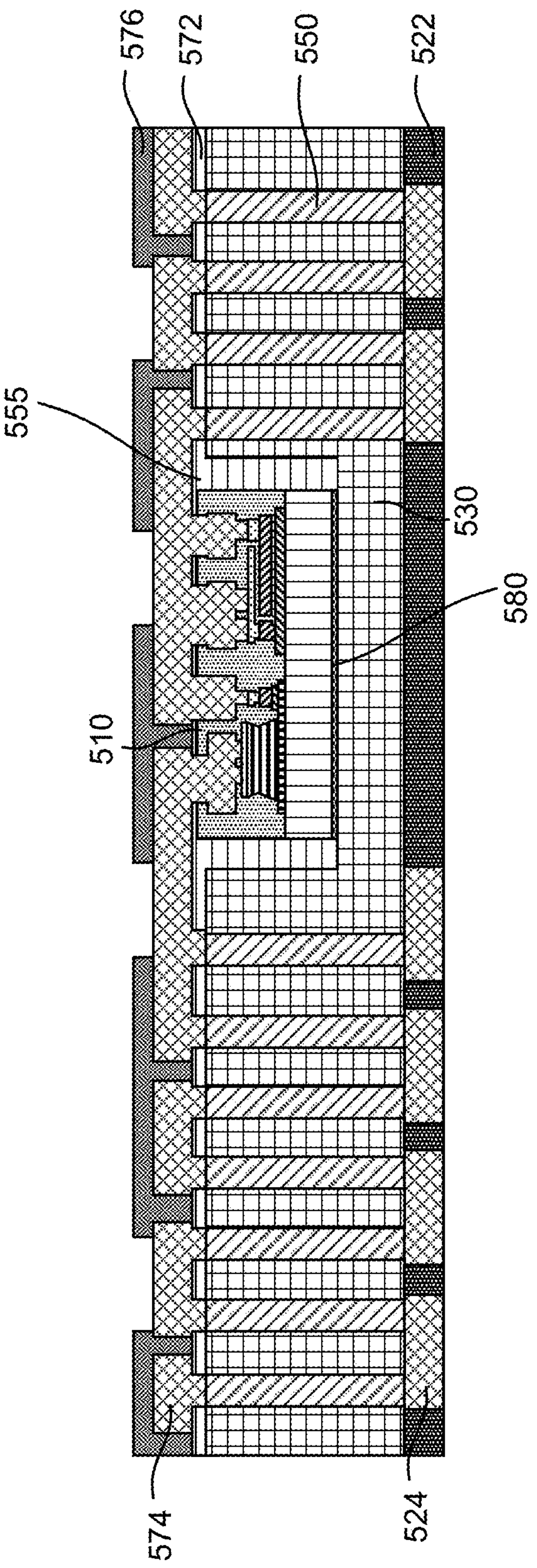

FIG. 7H illustrates a stage in which the frontside may be passivated. For example, a second backside ILD 576 may be formed on the frontside of the substrate 530. In an aspect, the second backside ILD 576 may be patterned to form openings that expose the frontside RDL metals 574.

Figure 7I:
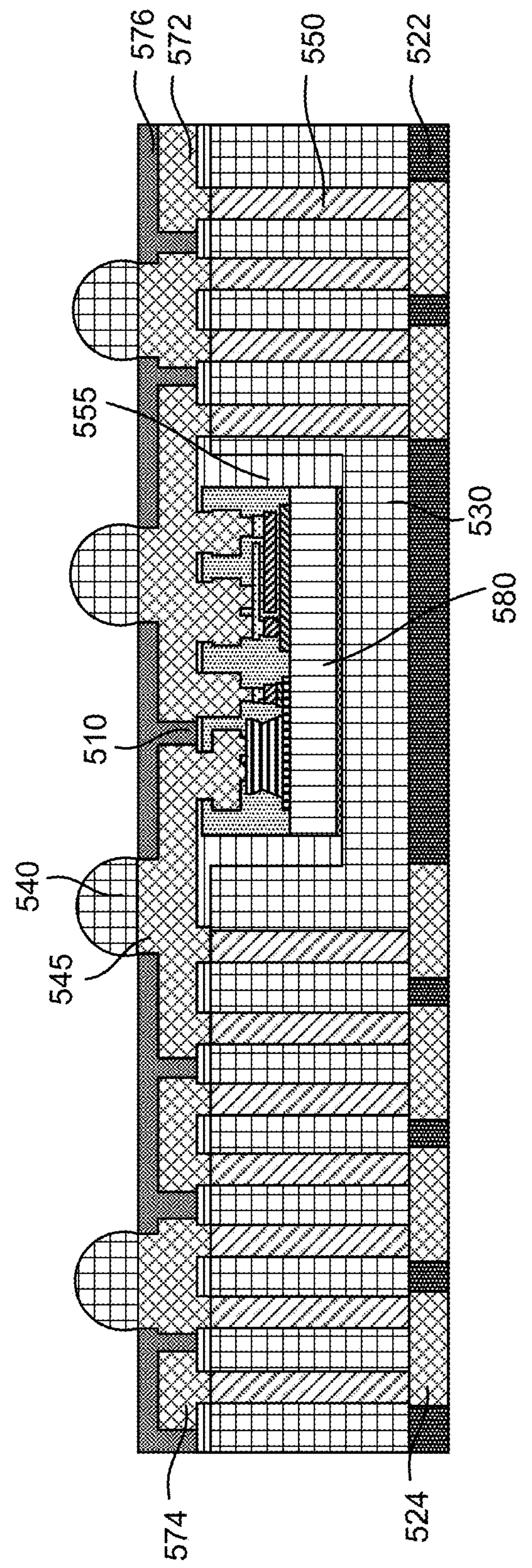

FIG. 7I illustrates a stage in which connections to external devices are provided. For example, UBMs 545 may be formed on the frontside RDL metals 574 within the exposed portions of the second backside ILD 576. Then the external connects 540 (e.g., bumps, balls, land grid array (LGA), C4, CuP, etc.) may be formed on the UBMs 545.

Figure 8:
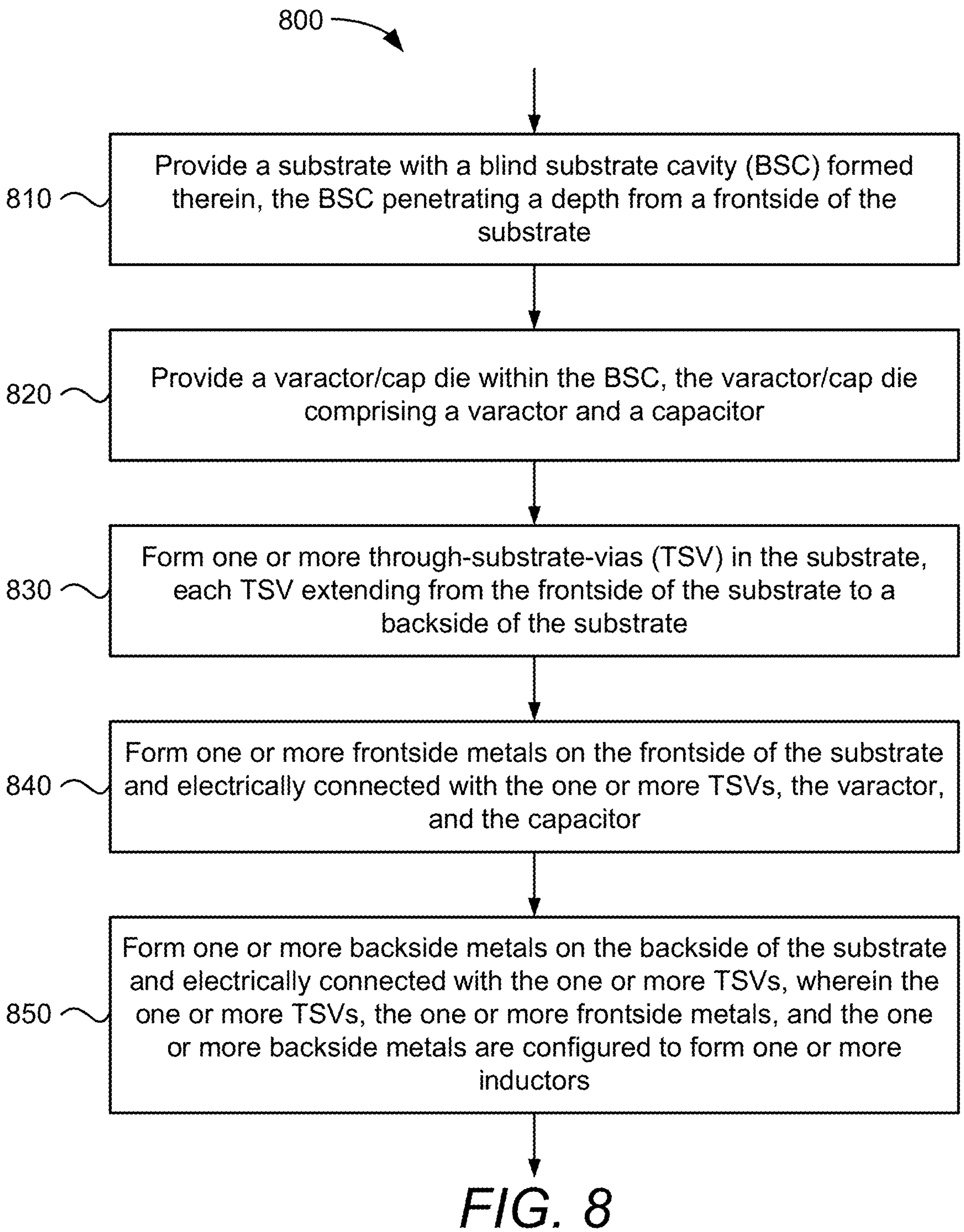
FIGS. 8 and 9 illustrate flow charts of example methods of manufacturing a multi-die module in accordance with at one or more aspects of the disclosure.

FIG. 8 illustrates a flow chart of an example method 800 of fabricating a tunable filter, such as the tunable filters 400 and/or 500, in accordance with at one or more aspects of the disclosure.

In block 810, a substrate 530 may be provided. A blind substrate cavity (BSC) 515 may be formed within the substrate 530. The BSC 515 may penetrate a depth from a frontside of the substrate 530. In an aspect, block 810 may correspond to the stage illustrated in FIG. 7A.

In block 820, a varactor/cap die 510 may be provided within the BSC 515. The varactor/cap die 510 may comprise a varactor 610 and a capacitor 620 (e.g., a MIM capacitor). In an aspect, block 820 may correspond to the stage illustrated in FIG. 7C.

In block 830, one or more through-substrate-vias (TSV) 550 may be formed in the substrate 530. Each TSV 550 may extend from the frontside of the substrate 530 to a backside of the substrate 530. In an aspect, block 830 may correspond to the stage illustrated in FIG. 7B.

In block 840, one or more frontside RDL metals 574 may be formed on the frontside of the substrate 530. The frontside RDL metals 574 may be electrically connected with the one or more TSVs 550, the varactor 610, and the capacitor 620. In an aspect, block 840 may correspond to the stage illustrated in FIG. 7F.

In block 850, one or more backside RDL metals 524 may be formed on the backside of the substrate 530. The backside RDL metals 524 may be electrically connected with the one or more TSVs 550. The one or more TSVs 550, the one or more frontside RDL metals 574, and the one or more backside RDL metals 524 may be configured to form one or more inductors 560. In an aspect, block 850 may correspond to the stage illustrated in FIG. 7F.

Figure 9:
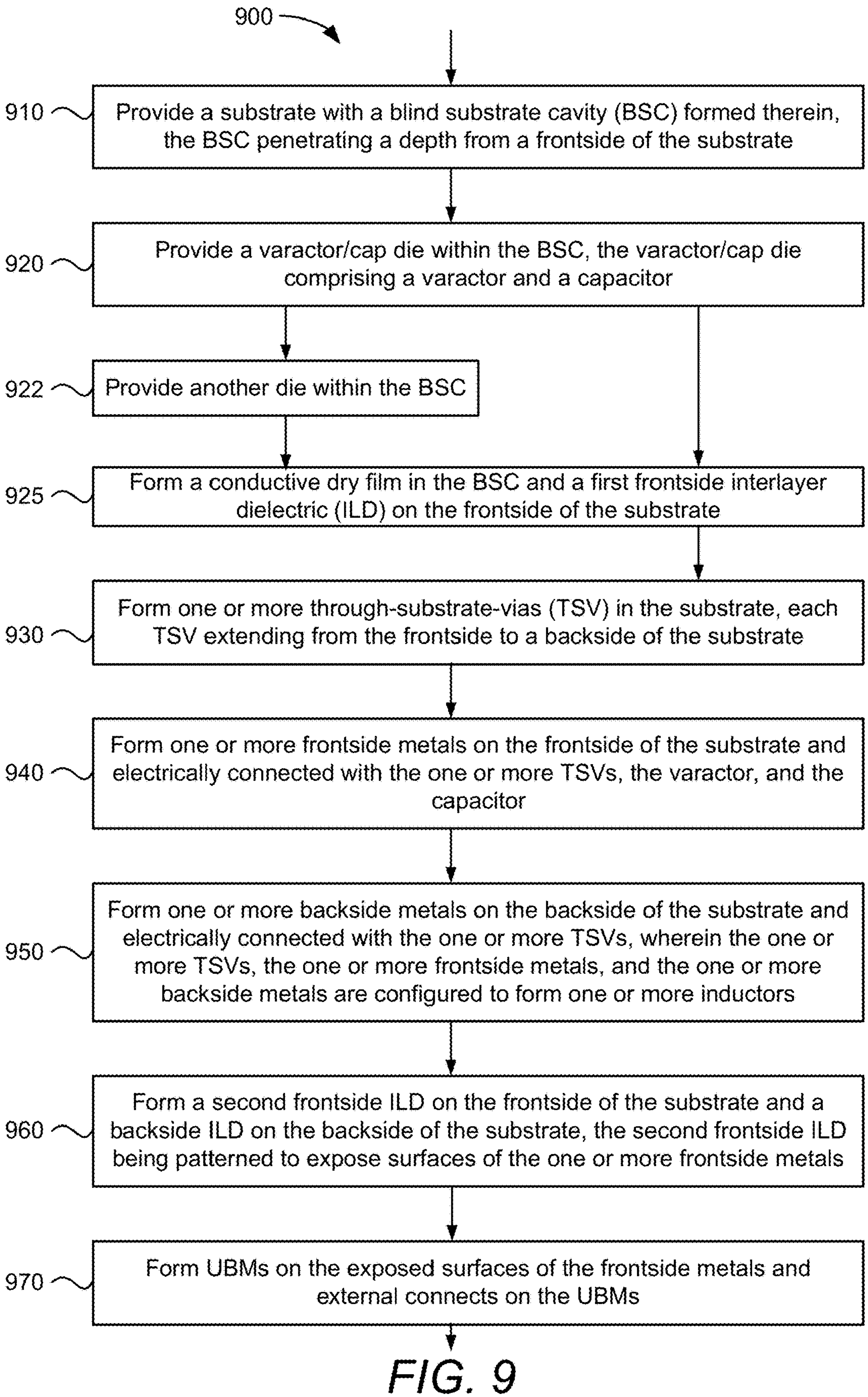

FIG. 9 illustrates a flow chart of an example method 900 of fabricating a tunable filter, such as the tunable filters 400 and/or 500, in accordance with at one or more aspects of the disclosure. FIG. 9 may be viewed as being more comprehensive than FIG. 8.

Block 910 may be similar to block 810. That is, in block 910, a substrate 530 may be provided. A blind substrate cavity (BSC) 515 may be formed within the substrate 530. The BSC 515 may penetrate a depth from a frontside of the substrate 530. In an aspect, block 910 may correspond to the stage illustrated in FIG. 7A.

Block 920 may be similar to block 820. That is, in block 920, a varactor/cap die 510 may be provided within the BSC 515. The varactor/cap die 510 may comprise a varactor 610 and a capacitor 620 (e.g., a MIM capacitor). In an aspect, block 920 may correspond to the stage illustrated in FIG. 7C.

In block 922 (which is optional) another die 512 may be placed within the BSC 515. In an aspect, block 920 may correspond to FIG. 5D.

In block 925, a thermally conductive dry film 555 and the first frontside ILD 572 may be formed. The dry film 555 may be formed to fill gaps between side surfaces of the BAC 515 and the varactor/cap die 510. The first frontside ILD 572 may be formed on the frontside of the substrate 530 and patterned to expose the TSVs 550 and varactor/cap connects 640 of the varactor/cap die 510. Block 925 may correspond to the stages illustrated in FIGS. 7D and 7E. While not shown, if the another die 512 is also provided in the BAC 515, then the dry film 555 may also fill gaps side surfaces of the BAC 515 and the another die 512. If necessary, the dry film 555 may further fill a gap between the varactor/cap die 510 and the another die 512.

Block 930 may be similar to block 830. That is, in block 930, one or more through-substrate-vias (TSV) 550 may be formed in the substrate 530. Each TSV 550 may extend from the frontside of the substrate 530 to a backside of the substrate 530. In an aspect, block 930 may correspond to the stage illustrated in FIG. 7B.

Block 940 may be similar to block 840. That is, in block 940, one or more frontside RDL metals 574 may be formed on the frontside of the substrate 530. The frontside RDL metals 574 may be electrically connected with the one or more TSVs 550, the varactor 610, and the capacitor 620. In an aspect, block 940 may correspond to the stage illustrated in FIG. 7F.

Block 950 may be similar to block 850. That is, in block 950, one or more backside RDL metals 524 may be formed on the backside of the substrate 530. The backside RDL metals 524 may be electrically connected with the one or more TSVs 550. The one or more TSVs 550, the one or more frontside RDL metals 574, and the one or more backside RDL metals 524 may be configured to form one or more inductors 560. In an aspect, block 950 may correspond to the stage illustrated in FIG. 7F.

In block 960, a second frontside ILD 576 may be formed on the frontside of the substrate 530, and a backside ILD 522 may be formed on the backside of the substrate 530. The second frontside ILD 576 may be patterned to expose surfaces of the one or more front side RDL metals 574. In an aspect, block 950 may correspond to the stage illustrated in FIG. 7H.

In block 970, UBMs 545 may be formed on the exposed surfaces of the frontside RDL metals 574. Also, external connects 545 may be formed on the UBMs 545. In an aspect, block 950 may correspond to the stage illustrated in FIG. 7I.

Figure 10:
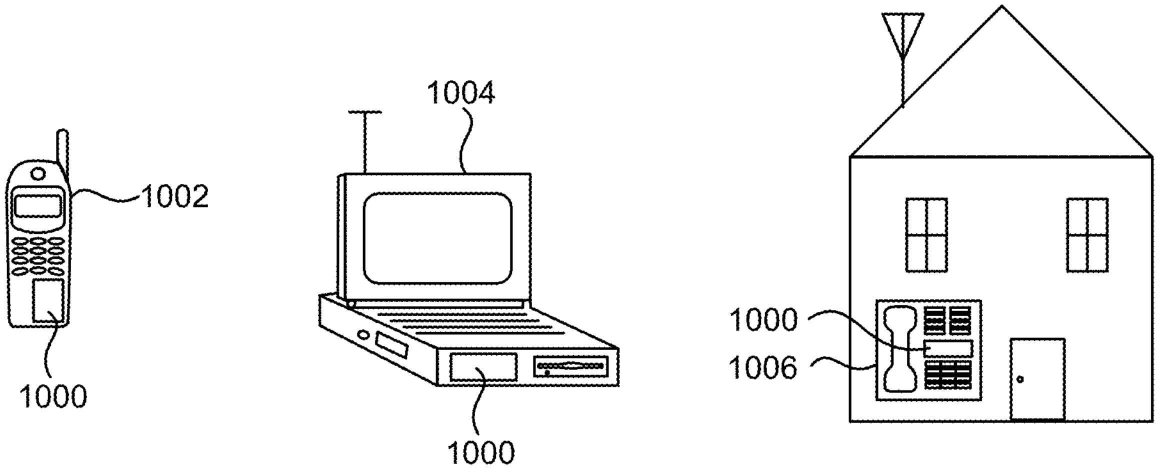
FIG. 10 illustrates various electronic devices which may utilize one or more aspects of the disclosure.

FIG. 10 illustrates various electronic devices 1000 that may be integrated with any of the aforementioned tunable filters in accordance with various aspects of the disclosure. For example, a mobile phone device 1002, a laptop computer device 1004, and a fixed location terminal device 1006 may each be considered generally user equipment (UE) and may include one or more tunable filters (e.g., tunable filters 400 and/or 500) as described herein. The devices 1002, 1004, 1006 illustrated in FIG. 10 are merely exemplary. Other electronic devices may also include the die packages including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

The foregoing disclosed devices and functionalities may be designed and configured into computer files (e.g., RTL, GDSII, GERBER, etc.) stored on computer-readable media. Some or all such files may be provided to fabrication handlers who fabricate devices based on such files. Resulting products may include semiconductor wafers that are then cut into semiconductor die and packaged into an antenna on glass device. The antenna on glass device may then be employed in devices described herein.

Implementation examples are described in the following numbered clauses:

Clause 1: A tunable filter, comprising: a substrate with a blind substrate cavity (BSC) formed therein, the BSC penetrating a depth from a frontside of the substrate; a varactor/cap die within the BSC, the varactor/cap die comprising a varactor and a capacitor; one or more through-substrate-vias (TSV) in the substrate, each TSV extending from the frontside of the substrate to a backside of the substrate; one or more frontside redistribution layer (RDL) metals on the frontside of the substrate and electrically connected with the one or more TSVs, the varactor, and the capacitor; and one or more backside RDL metals on the backside of the substrate and electrically connected with the one or more TSVs, wherein the one or more TSVs, the one or more frontside RDL metals, and the one or more backside RDL metals are configured to form one or more inductors.

Clause 2: The tunable filter of clause 1, wherein a thermal conductivity of the substrate is greater than 2 W/m-K.

Clause 3: The tunable filter of any of clauses 1-2, wherein the substrate is an alumina ceramic substrate, and wherein the one or more TSVs are one or more through-alumina-vias (TAV).

Clause 4: The tunable filter of any of clauses 1-4, wherein at least one inductor is a 3D inductor comprising one or more loops, each loop comprising at least one TAV in electrical connection with at least one frontside RDL metal and with at least one backside RDL metal.

Clause 5: The tunable filter of clause 4, wherein the one or more inductors comprise a plurality of 3D inductors.

Clause 6: The tunable filter of any of clauses 1-5, wherein the one or more TSVs are formed from any one or more of copper (Cu), aluminum (Al), and tungsten (W), or wherein the one or more frontside RDL metals are formed from any one or more of Cu, Al, and W, or wherein the one or more backside RDL metals are formed from any one or more of Cu, Al, and W, or any combination of the above.

Clause 7: The tunable filter of any of clauses 1-7, wherein the varactor is a III-V varactor.

Clause 8: The tunable filter of clause 7, wherein the varactor is a gallium arsenide (GaAs) varactor.

Clause 9: The tunable filter of any of clauses 7-8, wherein the varactor comprises a hyper-abrupt junction active layer.

Clause 10: The tunable filter of any of clauses 7-9, wherein a bias voltage of the varactor is 5v or less.

Clause 11: The tunable filter of any of clauses 1-10, wherein the capacitor is a metal-insulator-metal (MIM) capacitor.

Clause 12: The tunable filter of any of clauses 1-11, wherein the varactor/cap die further comprises: one or more varactor/cap connects in electrical connection with the varactor and the capacitor and with at least one frontside RDL metal.

Clause 13: The tunable filter of any of clauses 1-12, wherein the varactor/cap die further comprises: a varactor/cap substrate, wherein the varactor and the capacitor are formed on a first side of the varactor/cap substrate, and wherein a second side of the varactor/cap substrate is on a lateral surface of the substrate within the (BAC), the second side of the varactor/cap substrate being opposite the first side of the varactor/cap substrate.

Clause 14: The tunable filter of any of clauses 1-13, further comprising: another die within the BSC, wherein the another die is made from a technology different from a technology of the varactor/cap die.

Clause 15: The tunable filter of clause 14, wherein the technology of the another die is CMOS.

Clause 16: The tunable filter of any of clauses 1-15, wherein the tunable filter is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

Clause 17: A method of fabricating a tunable filter, the method comprising: providing a substrate with a blind substrate cavity (BSC) formed therein, the BSC penetrating a depth from a frontside of the substrate; providing a varactor/cap die within the BSC, the varactor/cap die comprising a varactor and a capacitor; forming one or more through-substrate-vias (TSV) in the substrate, each TSV extending from the frontside of the substrate to a backside of the substrate; forming one or more frontside redistribution layer (RDL) metals on the frontside of the substrate and electrically connected with the one or more TSVs, the varactor, and the capacitor; and forming one or more backside RDL metals on the backside of the substrate and electrically connected with the one or more TSVs, wherein the one or more TSVs, the one or more frontside RDL metals, and the one or more backside RDL metals are configured to form one or more inductors.

Clause 18: The method of clause 17, wherein a thermal conductivity of the substrate is greater than 2 W/m-K.

Clause 19: The method of any of clauses 17-18, wherein the substrate is an alumina ceramic substrate, and wherein the one or more TSVs are one or more through-alumina-vias (TAV).

Clause 20: The method of any of clauses 17-19, wherein at least one inductor is a 3D inductor comprising one or more loops, each loop comprising at least one TAV in electrical connection with at least one frontside RDL metal and with at least one backside RDL metal.

Clause 21: The method of clause 20, wherein the one or more inductors comprise a plurality of 3D inductors.

Clause 22: The method of any of clauses 17-21, wherein the one or more TSVs are formed from any one or more of copper (Cu), aluminum (Al), and tungsten (W), or wherein the one or more frontside RDL metals are formed from any one or more of Cu, Al, and W, or wherein the one or more backside RDL metals are formed from any one or more of Cu, Al, and W, or any combination of the above.

Clause 23: The method of any of clauses 17-22, wherein the varactor is a III-V varactor.

Clause 24: The method of clause 23, wherein the varactor is a gallium arsenide (GaAs) varactor.

Clause 25: The method of any of clauses 23-24, wherein the varactor comprises a hyper-abrupt junction active layer.

Clause 26: The method of any of clauses 23-25, wherein a bias voltage of the varactor is 5v or less.

Clause 27: The method of any of clauses 17-26, wherein the capacitor is a metal-insulator-metal (MIM) capacitor.

Clause 28: The method of any of clauses 17-27, wherein the varactor/cap die further comprises: one or more varactor/cap connects in electrical connection with the varactor and the capacitor and with at least one frontside RDL metal.

Clause 29: The method of any of clauses 17-28, wherein the varactor/cap die further comprises: a varactor/cap substrate, wherein the varactor and the capacitor are formed on a first side of the varactor/cap substrate, and wherein a second side of the varactor/cap substrate is on a lateral surface of the substrate within the (BAC), the second side of the varactor/cap substrate being opposite the first side of the varactor/cap substrate.

Clause 30: The method of any of clauses 17-28, further comprising: providing another die within the BSC, wherein the another die is made from a technology different from a technology of the varactor/cap die.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to either an uplink/reverse or downlink/forward traffic channel.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described herein can be configured to perform at least a portion of a method described herein.

It should be noted that the terms "connected," "coupled," or any variant thereof, mean any connection or coupling, either direct or indirect, between elements, and can encompass a presence of an intermediate element between two elements that are "connected" or "coupled" together via the intermediate element unless the connection is expressly disclosed as being directly connected.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or one or more claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods, systems, and apparatus disclosed in the description or in the claims can be implemented by a device comprising means for performing the respective actions and/or functionalities of the methods disclosed.

Furthermore, in some examples, an individual action can be subdivided into one or more sub-actions or contain one or more sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A tunable filter, comprising:

a substrate with a blind substrate cavity (BSC) formed therein, the BSC penetrating a depth from a frontside of the substrate;

a varactor/cap die within the BSC, the varactor/cap die comprising a varactor and a capacitor;

a conductive dry film, the conductive dry film located in a gap between a side surface of the BSC and the varactor/cap die;

one or more through-substrate-vias (TSV) in the substrate, each TSV extending from the frontside of the substrate to a backside of the substrate;

one or more frontside redistribution layer (RDL) metals on the frontside of the substrate and electrically connected with the one or more TSVs, the varactor, and the capacitor; and one or more backside RDL metals on the backside of the substrate and electrically connected with the one or more TSVs, wherein the one or more TSVs, the one or more frontside RDL metals, and the one or more backside RDL metals are configured to form one or more inductors, wherein the varactor/cap die further comprises:

a varactor/cap substrate, wherein the varactor and the capacitor are formed on and in contact with a first side of the varactor/cap substrate, wherein both metal electrodes of the capacitor are electrically coupled to the one or more frontside RDL metals, and wherein a second side of the varactor/cap substrate is on a lateral surface of the substrate within the (BAC), the second side of the varactor/cap substrate being opposite the first side of the varactor/cap substrate.

2. The tunable filter of claim 1, wherein a thermal conductivity of the substrate is greater than 2 W/m-K.

3. The tunable filter of claim 1,
wherein the substrate is an alumina ceramic substrate, and
wherein the one or more TSVs are one or more through-alumina-vias (TAV).

4. The tunable filter of claim 1, wherein at least one inductor is a 3D inductor comprising one or more loops, each loop comprising at least one TAV in electrical connection with at least one frontside RDL metal and with at least one backside RDL metal.

5. The tunable filter of claim 4, wherein the one or more inductors comprise a plurality of 3D inductors.

6. The tunable filter of claim 1,
wherein the one or more TSVs are formed from any one or more of copper (Cu), aluminum (Al), and tungsten (W), or
wherein the one or more frontside RDL metals are formed any one or both of Cu, Al, and W, or
wherein the one or more backside RDL metals are formed any one or both of Cu, Al, and W, or
any combination of the above.

7. The tunable filter of claim 1, wherein the varactor is a III-V varactor.

8. The tunable filter of claim 7, wherein the varactor is a gallium arsenide (GaAs) varactor.

9. The tunable filter of claim 7, wherein the varactor comprises a hyper-abrupt junction active layer.

10. The tunable filter of claim 7, wherein a bias voltage of the varactor is 5v or less.

11. The tunable filter of claim 1, wherein the capacitor is a metal-insulator-metal (MIM) capacitor.

12. The tunable filter of claim 1, wherein the varactor/cap die further comprises:
one or more varactor/cap connects in electrical connection with the varactor and the capacitor and with at least one frontside RDL metal.

13. The tunable filter of claim 1, further comprising:
another die within the BSC,
wherein the another die is made from a technology different from a technology of the varactor/cap die.

14. The tunable filter of claim 13, wherein the technology of the another die is CMOS.

15. The tunable filter of claim 1, wherein the tunable filter is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

16. A method of fabricating a tunable filter, the method comprising:
providing a substrate with a blind substrate cavity (BSC) formed therein, the BSC penetrating a depth from a frontside of the substrate;
providing a varactor/cap die within the BSC, the varactor/cap die comprising a varactor and a capacitor;
filling a gap between a side surface of the BSC and the varactor/cap die with a conductive dry film;
forming one or more through-substrate-vias (TSV) in the substrate, each TSV extending from the frontside of the substrate to a backside of the substrate;
forming one or more frontside redistribution layer (RDL) metals on the frontside of the substrate and electrically connected with the one or more TSVs, the varactor, and the capacitor; and
forming one or more backside RDL metals on the backside of the substrate and electrically connected with the one or more TSVs,
wherein the one or more TSVs, the one or more frontside RDL metals, and the one or more backside RDL metals are configured to form one or more inductors,
wherein the varactor/cap die further comprises:
a varactor/cap substrate,
wherein the varactor and the capacitor are formed on and in contact with a first side of the varactor/cap substrate,
wherein both metal electrodes of the capacitor are electrically coupled to the one or more frontside RDL metals, and
wherein a second side of the varactor/cap substrate is on a lateral surface of the substrate within the (BAC), the second side of the varactor/cap substrate being opposite the first side of the varactor/cap substrate.

17. The method of claim 16, wherein a thermal conductivity of the substrate is greater than 2 W/m-K.

18. The method of claim 16,
wherein the substrate is an alumina ceramic substrate, and
wherein the one or more TSVs are one or more through-alumina-vias (TAV).

19. The method of claim 16, wherein at least one inductor is a 3D inductor comprising one or more loops, each loop comprising at least one TAV in electrical connection with at least one frontside RDL metal and with at least one backside RDL metal.

20. The method of claim 19, wherein the one or more inductors comprise a plurality of 3D inductors.

21. The method of claim 16,
wherein the one or more TSVs are formed from any one or more of copper (Cu), aluminum (Al), and tungsten (W), or
wherein the one or more frontside RDL metals are formed from any one or both of Cu, Al, and W, or
wherein the one or more backside RDL metals are formed from any one or both of Cu, Al, and W, or
any combination of the above.

22. The method of claim 16, wherein the varactor is a III-V varactor.

23. The method of claim 22, wherein the varactor is a gallium arsenide (GaAs) varactor.

24. The method of claim 22, wherein the varactor comprises a hyper-abrupt junction active layer.

25. The method of claim 22, wherein a bias voltage of the varactor is 5v or less.

26. The method of claim 16, wherein the capacitor is a metal-insulator-metal (MIM) capacitor.

27. The method of claim 16, wherein the varactor/cap die further comprises:
one or more varactor/cap connects in electrical connection with the varactor and the capacitor and with at least one frontside RDL metal.

28. The method of claim 16, further comprising:
providing another die within the BSC,
wherein the another die is made from a technology different from a technology of the varactor/cap die.

* * * * *